United States Patent
Huang et al.

(10) Patent No.: US 9,985,077 B2
(45) Date of Patent: May 29, 2018

(54) SERIAL MODULE OF ORGANIC SOLAR CELL AND METHOD FOR MANUFACTURING THE SAME

(71) Applicant: ATOMIC ENERGY COUNCIL—INSTITUTE OF NUCLEAR ENERGY RESEARCH, Taoyuan County (TW)

(72) Inventors: Yu-Ching Huang, Taoyuan County (TW); De-Han Lu, Taoyuan County (TW); Hou-Chin Cha, Taoyuan County (TW); Cheng-Wei Chou, Taoyuan County (TW); Chih-Min Chuang, Taoyuan County (TW); Yeong-Der Lin, Taoyuan County (TW); Charn-Ying Chen, Taoyuan County (TW); Cheng-Si Tsao, Taoyuan County (TW)

(73) Assignee: ATOMIC ENERGY COUNCIL—INSTITUTE OF NUCLEAR ENERGY RESEARCH, Taoyuan County (TW)

( * ) Notice: Subject to any disclaimer, the term of this patent is extended or adjusted under 35 U.S.C. 154(b) by 192 days.

(21) Appl. No.: 14/516,804

(22) Filed: Oct. 17, 2014

(65) Prior Publication Data
US 2015/0380465 A1    Dec. 31, 2015

(30) Foreign Application Priority Data
Jun. 25, 2014   (TW) .............................. 103121800 A

(51) Int. Cl.
*H01L 31/00* (2006.01)
*H01L 27/30* (2006.01)
(Continued)

(52) U.S. Cl.
CPC ........ *H01L 27/301* (2013.01); *H01L 51/4253* (2013.01); *H01L 51/441* (2013.01)

(58) Field of Classification Search
CPC .. H01L 27/301; H01L 51/4253; H01L 51/441
See application file for complete search history.

(56) References Cited

U.S. PATENT DOCUMENTS

2003/0180983 A1\* 9/2003 Oswald .................. H01L 31/18
                                                                  438/57

OTHER PUBLICATIONS

Girotto et al., High-Performance Organic Solar Cells with Spray-Coated Hole-Transport and Active Layers, Adv Functional Mats, 2011, 21, 64-72.\*

\* cited by examiner

*Primary Examiner* — Shannon Gardner
(74) *Attorney, Agent, or Firm* — Rosenberg, Klein & Lee

(57) ABSTRACT

The present invention relates to a serial module of organic solar cells and the method for manufacturing the same. The structure comprises a transparent conductive layer composed by a plurality of conductive blocks, an active layer having notches on the periphery, and a metal layer composed by a plurality of metal blocks. The active layer according to the present invention is a complete layer except the notches on the periphery for exposing a portion of the transparent conductive layer. The metal blocks can contact the conductive blocks of adjacent organic solar cell via the exposure areas and thus connecting the organic solar cells in series. The present invention can improves the power generating efficiency of organic solar cells in a limited space, which is beneficial to the development of promotion of future organic solar cells.

7 Claims, 9 Drawing Sheets

(51) Int. Cl.
*H01L 51/42* (2006.01)
*H01L 51/44* (2006.01)

SERIAL MODULE OF ORGANIC SOLAR CELL AND METHOD FOR MANUFACTURING THE SAME

FIELD OF THE INVENTION

The present invention relates generally to a serial module of organic solar cell, and particularly to a serial module of organic solar cell with thin-film form and the method for manufacturing the same. The serial module of organic solar cell has a special stack structure, which enhances the power generating effective area in the limited cell space when organic solar cells are connected in series, and thereby improving power generation per unit area (namely, total area) and satisfying the demand of electronic products.

BACKGROUND OF THE INVENTION

Organic solar cells with thin film form are light, flexible, transparent, low cost, customizable, and applicable to non-vacuum all-solution large-area printing and coating process. In recent year, they play an important role in the application of renewable energy. The trend of their development attracts attention by academics and the industry.

Currently, for preparing an organic solar cell module having a serial structure, as shown in FIG. 1, a plurality of organic solar cells are disposed on the substrate 90. Each cell includes a stack structure comprising a transparent conductive layer 91, an electron transport layer 92, an active layer 93, a hole transport layer 94, and a metal layer 95. While stacking the electron transport layer 92, the active layer 93, the hole transport layer 94, and the metal layer 95, each layer is shifted for filling the gaps in the transparent conductive layer 91 and connecting multiple cells in series by enabling the transparent conductive layer 91 to contact the metal layer 95.

The effective power generating area $A_{Eff}$ of the organic solar cells having such kind of serial structure is shown in the figure. The effective area is influenced by the gap in the transparent conductive layer 91. A large portion of the light receiving area of the organic solar cells is wasted in the gaps not capable of generating power and thus limiting the power generated per unit of total area. In order to avoid waste in the power generating area of the module, the gaps in the transparent conductive layer 91 are shrunk as small as possible. Nonetheless, the shifts of the layer are accordingly extremely small, leading to difficulty in preparation. In particular, when large-area solution printing processes, such as spray coating, inkjet printing, and roll-to-roll printing, are applied, the accuracy of the shifts of the layers is hard to control. A very small error in shift might destroy the serial relation of the cells and affect the power generating efficiency.

Accordingly, the present invention provides a novel serial module of organic solar cell, which improves the power per unit area generated by the power generating module. Beside, it also reduces the difficulty in large-area solution printing processes. Thereby, the present invention facilitates commercialization and promotion of organic solar cells.

SUMMARY

An objective of the present invention is to provide a serial module of organic solar cell. The present invention moves the contact location of the cathode and anode of an organic solar cell to the two edges of the whole structure. The two edges have a saw-toothed active layer, which enables the cathode and anode of adjacent cells to contact. In addition, the central region of the whole structure will have a more efficient power generating area. The power generation per unit of total area of the cell is increased. Thereby, a miniature cell module is provided and applicable to the development of future small electronic devices.

Another objective of the present invention is to provide a serial module of organic solar cell in thin film form, which is structure multiple organic solar cells connected in series. According to the requirement, the output voltage can be raised by increasing the number of serial cells, which enhances flexibility in applications.

Still another objective of the present invention is to provide a method for manufacturing a serial module of organic solar cell, which can be completed by using the currently available preparation techniques such etching, non-vacuum solution printing, and vapor deposition. No extra production cost is added.

A further objective of the present invention is to provide a serial module of organic solar cell, which enables one-time complete deposition of layers without the need of micro shifts in various layers. Thereby, the problem of misalignment occurred in preparing organic solar cell according to the prior art can be avoided. In addition, the complexity of process is simplified as well.

In order to achieve the objectives described above, the present invention discloses a serial module of organic solar cell. The structure of the serial module of organic solar cell at least comprises a serial module of organic solar cell, an active layer, and a metal layer. The serial module of organic solar cell comprises a transparent conductive layer. The transparent conductive layer comprises a plurality of conductive blocks. There is a first gap between any two adjacent conductive blocks. The edges of any of the plurality of conductive blocks include a first side edge and a second side edge corresponding to each other. The first side edge and the second side edge intersect at the first gap. The active layer is disposed on the transparent conductive layer. The active layer has a plurality of notches on the edges. Each conductive block includes a first exposure area or a second exposure area exposed outside the active layer interlacedly via the plurality of notches along the first side edge or the second side edge. The metal layer is disposed on the active layer, and includes a plurality of metal blocks. There is a second gap between any adjacent metal blocks. Besides, the plurality of metal blocks have a contact part extending towards the same side and overlapping at the first gap adjacent to the side in the vertical direction. After overlapping the first gap, the contact part extends downwards from the plurality of notches and contacts the first or second exposure area of the plurality of conductive blocks. Moreover, the first gap corresponds to the second gap vertically.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
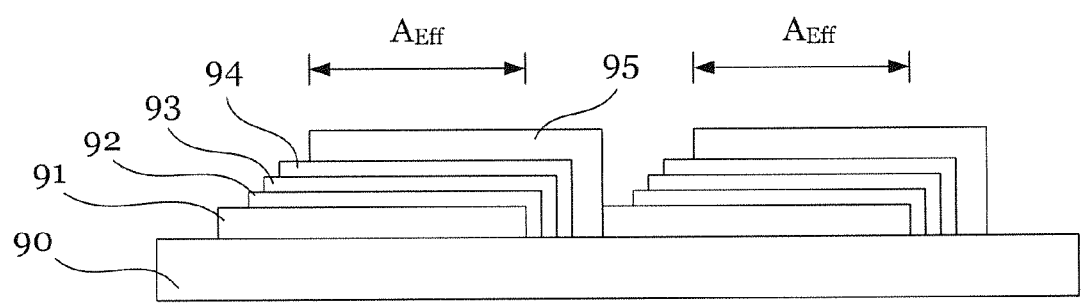
FIG. 1 shows a schematic diagram of the serial module of organic solar cell according to the prior art.
Figure 2:
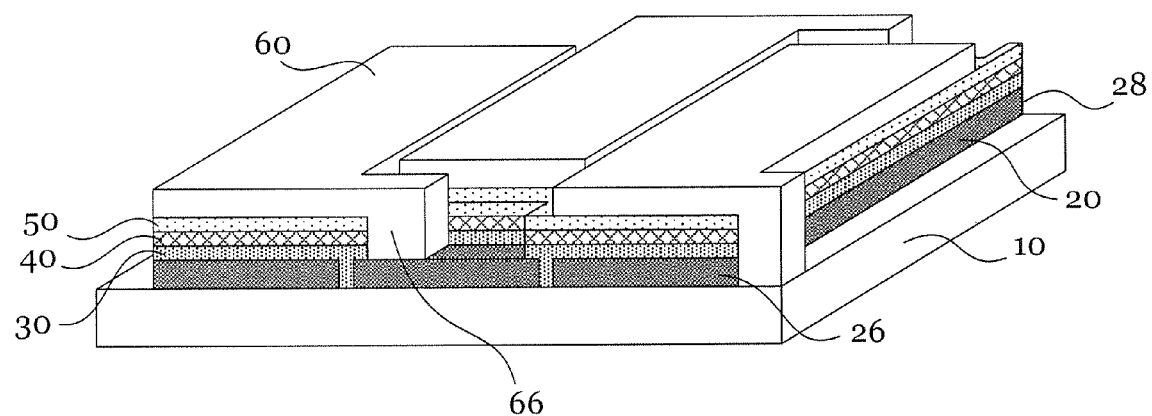
FIG. 2 shows a schematic diagram of the serial module of organic solar cell according to the present invention.
Figure 3:
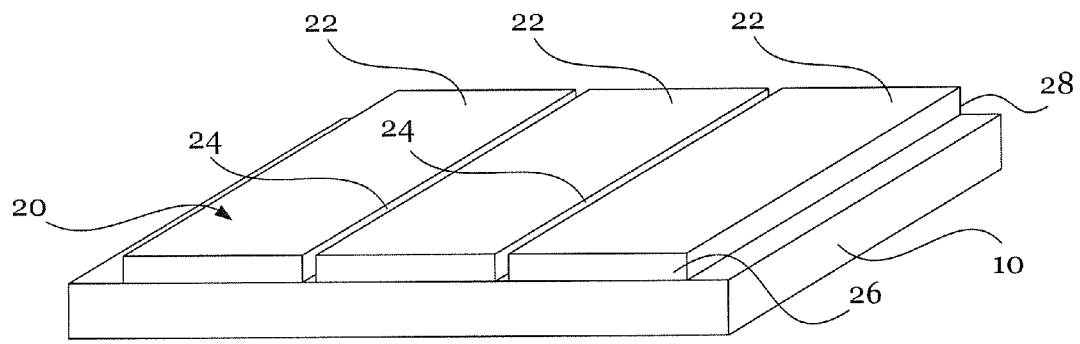
FIG. 3 shows a structural schematic diagram of disposing the transparent conductive layer on the substrate while manufacturing the module according to a preferred embodiment of the present invention.

First, please refer to FIG. 2, which shows a schematic diagram of the serial module of organic solar cell according to the present invention. The structure comprises a substrate 10, a transparent conductive layer 20, an electron transport layer 30, an active layer 40, a hole transport layer 50, a metal layer 60, and contact parts 66. The transparent conductive layer 20 is disposed on the substrate 10. The electron transport layer 30 is disposed on the transparent conductive layer 20. The active layer 40 is disposed on the electron transport layer 30. The hole transport layer 50 is disposed on the active layer 40. The metal layer 60 is disposed on the hole transport layer 50, and contacts the transparent conductive layer 20 via its contact part 66. The layers described above are general structures in organic solar cells. Technically, the present invention is characterized in the special layout of various layers, so that the metal layer 60 can contact the transparent conductive layer 20 while achieving the purpose of optimum area for power generation.

Please refer to FIG. 2 and the sequential process steps shown in FIGS. 3 to 7. As shown in the figures, the transparent conductive layer 20 on the substrate 10 is formed by a plurality of conductive blocks 22. There is a first gap 24 between two adjacent conductive blocks 22. Any conductive block 22 includes a first side edge 26 and a second side edge 28 corresponding to each other. The first gaps 24 in the transparent conductive layer 20 can be formed by etching or laser process. The width of the first gaps 24 is greater than 0 mm and smaller than 20 mm. The first gaps 24 can be extremely small given the conductive blocks 2 of the transparent layer 20 do not contact each other. Each of the plurality of conductive blocks 22 is the cathode of a single organic solar cell.

Figure 4A:
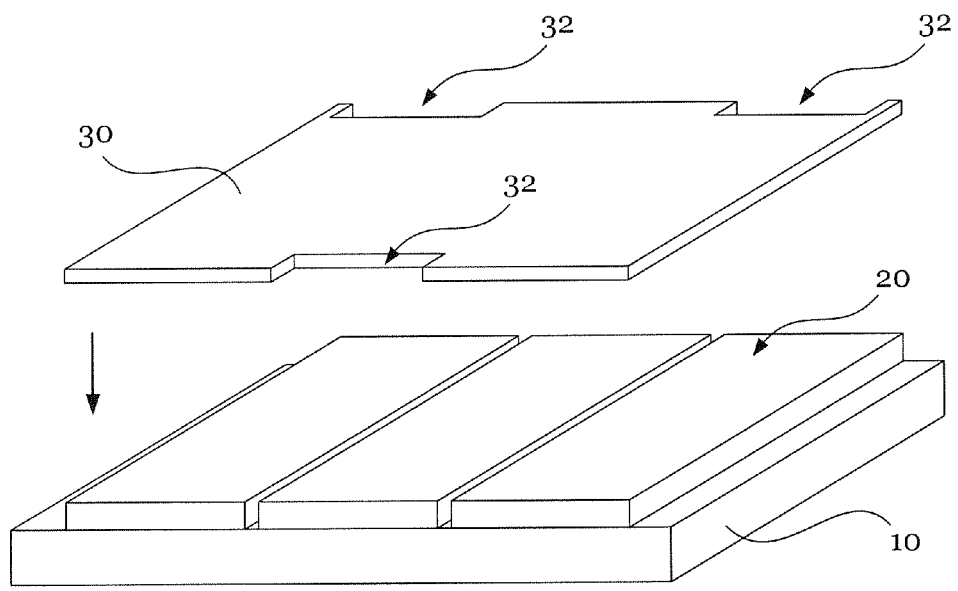
FIG. 4A shows a structural schematic diagram of disposing the electron transport layer having notches on the transparent conductive layer while manufacturing the module according to a preferred embodiment of the present invention.
Figure 4B:
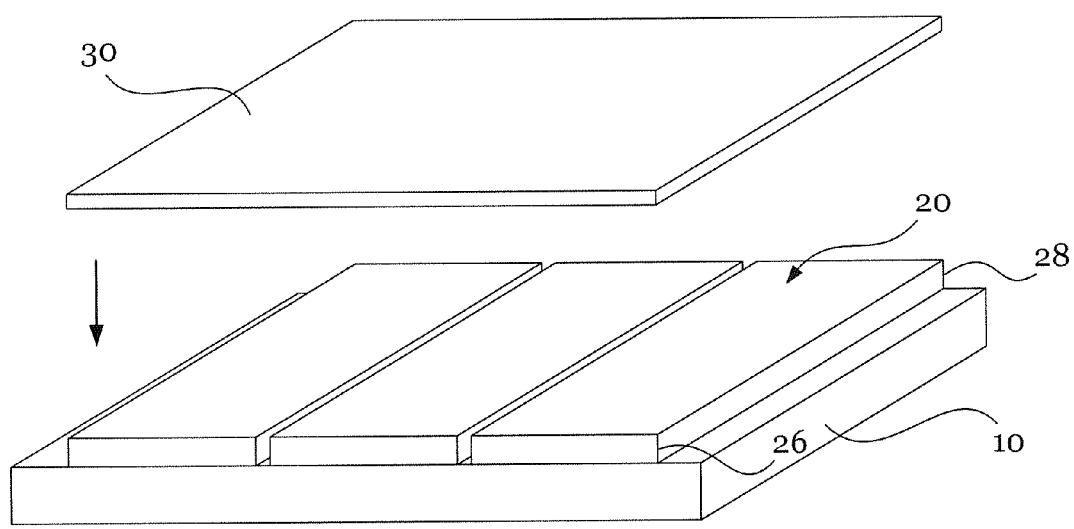
FIG. 4B shows a structural schematic diagram of disposing the electron transport layer without notch on the transparent conductive layer while manufacturing the module according to another preferred embodiment of the present invention.

Next, the layer disposed on the transparent conductive layer 20 can be the active layer 40. Nonetheless, as shown in FIG. 4A, before disposing the active layer 40 according to the present invention, the electron transport layer 30 is first disposed on the transparent conductive layer 20. The electron transport layer 30 is patterned and includes a plurality of notches 32 on its periphery. Thereby, even if the transparent conductive layer 20 located below is covered by the electron transport layer 30, a portion of its surface is still not covered by the electron transport layer 30. The region close to the first side edge 26 is the first exposure area 27, while the region close to the second side edge 28 is the second exposure area 29. The two exposure areas are located sequentially and interlacedly on different conductive blocks 22. In addition, FIG. 4B shows another embodiment of the present invention. According to the embodiment, the electron transport layer 30 is not patterned and no notch is disposed. Instead, a complete electron transport layer 30 is formed on the transparent conductive layer 20 and aligning the edges of electron transport layer 30 with those of the transparent conductive layer. This arrangement has no obvious influence on the power generating efficiency of the finished product of solar cells. It can be an option for reducing the process steps by omitting the pattering process.

Because the surface of the transparent conductive layer 20 might be uneven and in order to improve the lifetime of organic solar cells, the electron transport layer 30 is disposed. By adding a layer of oxide, such as zinc oxide, the surface of the transparent conductive layer 20 is modified and charge transport is facilitated as well. Besides, the first gaps 24 of the transparent conductive layer 20 will be filled by the material of the electron transport layer 30 while disposing the electron transport layer 30.

Figure 5A:
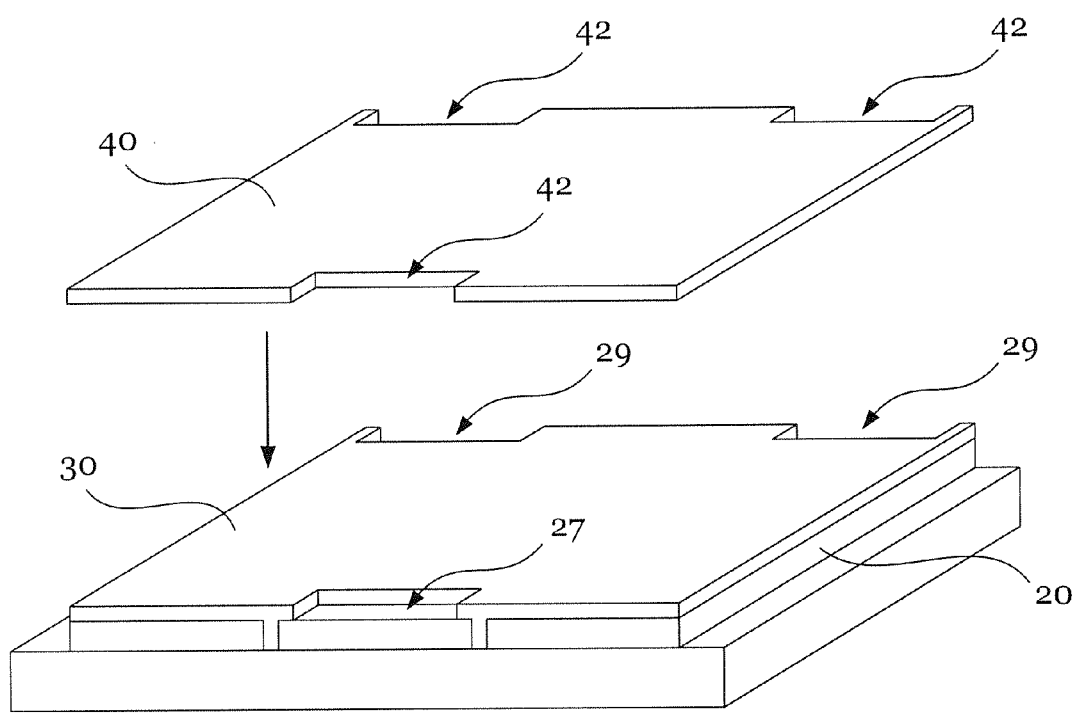
FIG. 5A shows a structural schematic diagram of disposing the active layer on the electron transport layer having notches while manufacturing the module according to a preferred embodiment of the present invention.
Figure 5B:
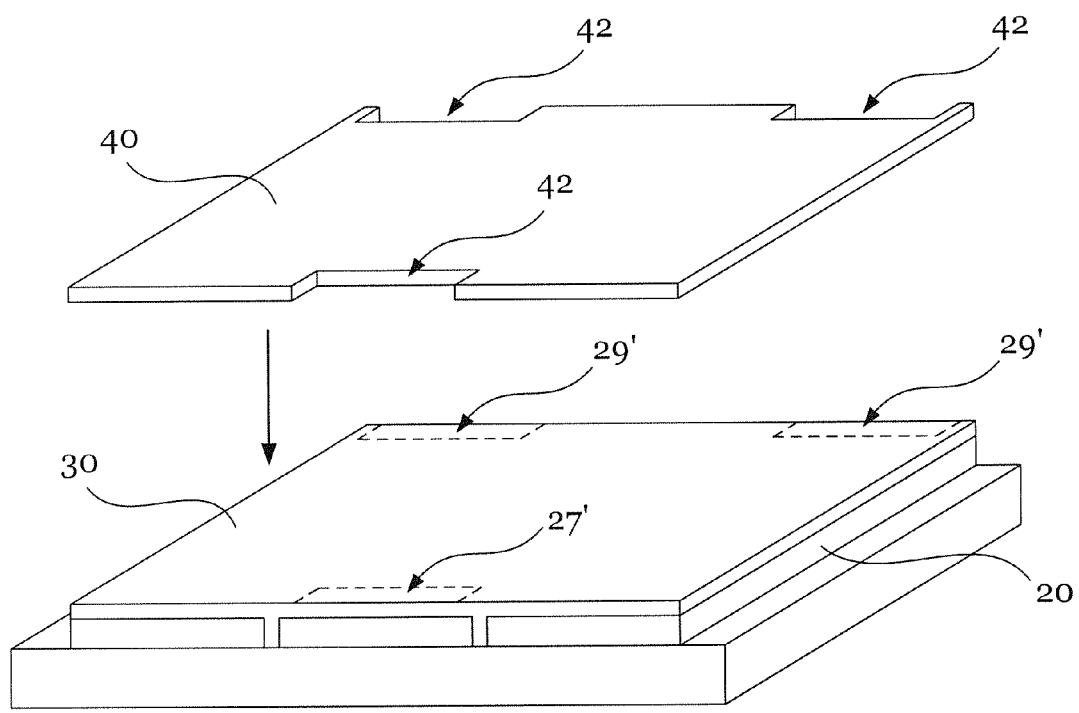
FIG. 5B shows a structural schematic diagram of disposing the active layer on the electron transport layer without notch while manufacturing the module according to another preferred embodiment of the present invention.
Figure 6:
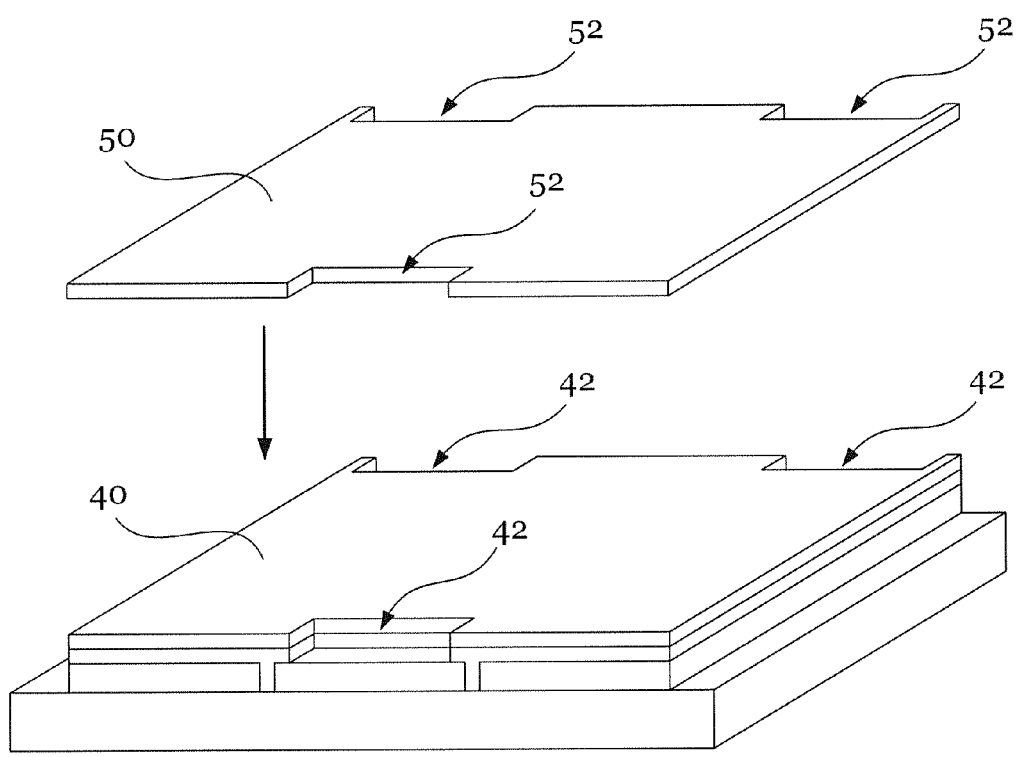
FIG. 6 shows a structural schematic diagram of disposing the hole transport layer on the active layer while manufacturing the module according to a preferred embodiment of the present invention.
Figure 7:
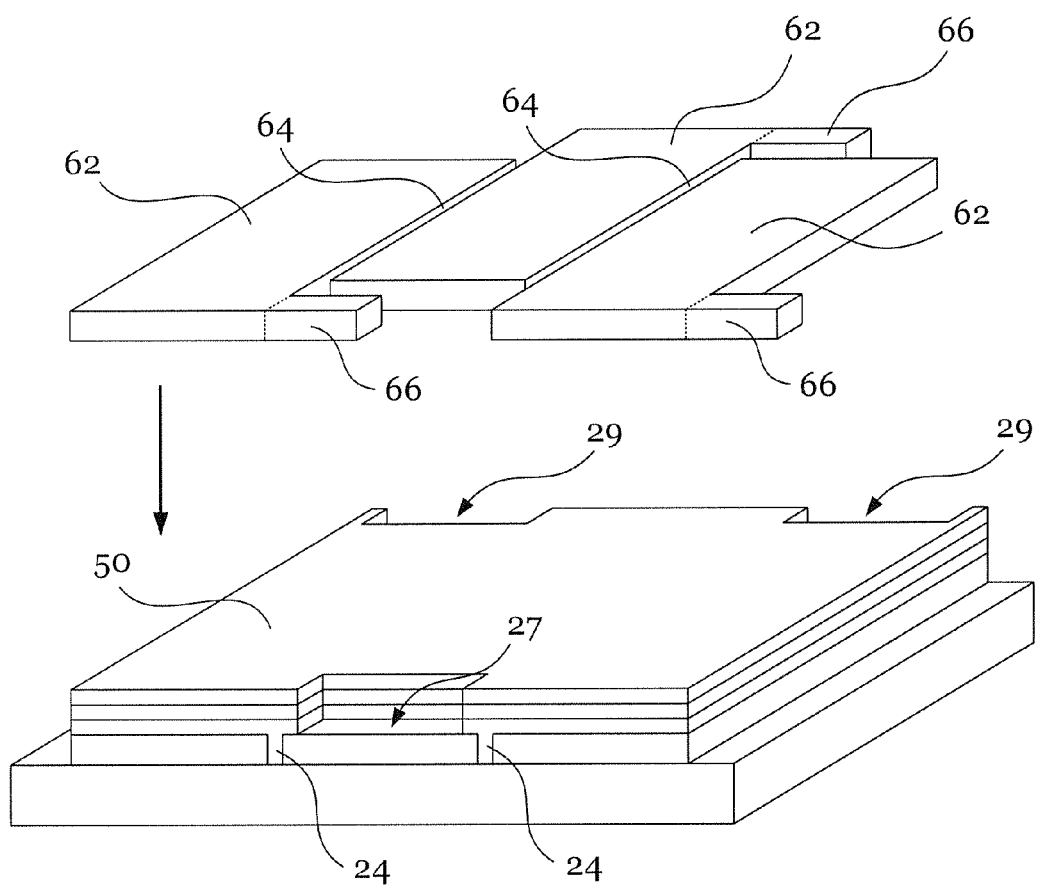
FIG. 7 shows a structural schematic diagram of disposing the hole transport layer on the active layer while manufacturing the module according to a preferred embodiment of the present invention.

The active layer 40 is disposed on the electron transport layer 30. The active layer 40 is patterned and includes a plurality of notches 42 on its periphery. If the electron transport layer 30 below includes the notches 32, as shown in FIG. 5A, the edges of the active layer 40 are aligned with those of the electron transport layer 30 and keeping the first and second exposure areas 27, 29 of the transparent conductive layer 20 uncovered. On the contrary, if the electron transport layer 30 has no notch, as shown in FIG. 5B, the notches 42 of the active layer 40 expose the first and second exposure areas 27', 29'.

The function of the active layer 40 is to absorb the excitons (electron-hole pairs) generated by the sunlight. The excitons are dissociated and generating electrons and holes. The charges are transferred to the corresponding electrodes where currents occur. The active layer 40 is formed by mixing electron donor materials and electron acceptor materials. One choice for the electron donor material is Poly(3-hexyl-thiophene-2,5-diyl) (P3HT), and one choice for the electron acceptor is [6,6]-phenyl-$C_{61}$-butyric acid methyl ester (PCBM). They form a P3HT/PCBM combination. The excitons formed by P3HT after absorbing photo energy drift to the junction of P3HT and PCBM and are dissociated into electrons and holes. Then, the electrons are conducted to the cathode, while the holes are conducted to the anode, and thus forming currents.

Before disposing the metal layer 60 on the active layer 60, a hole transport layer 50 can be first disposed. The hole transport layer 50 needs to be patterned for forming a plurality of notches 52 on its periphery and aligning with the active layer 40 below. Hence, the first exposure area 27 (or 27') and the second exposure area 29 (or 29') are maintained exposed. The hole transport layer 50 can be composed of conductive polymers, such as PEDOT:PSS, for facilitating hole conduction.

The metal layer 60 is disposed on the hole transport layer 50 and used as the anode of the organic solar cell. The metal layer 60 is formed by a plurality of metal blocks 62. There are second gaps 64 between adjacent vapor-deposited metal blocks. In addition, the contact parts 66 of the plurality of metal blocks 62 contact downwards the first and second exposure areas 27, 29 via the notches 32, 42, 52 described above or the first and second exposure areas 27', 29' via the notches 42, 52. More specifically, each metal block 62 will contact either the first exposure area 27 (or 27') or the second exposure area 29 (29') but not both. Furthermore, in order to optimize the effective area of power generation, each metal block 62 overlaps the neighboring first gap 24 in the vertical direction via the contact part extending in the same side. Afterwards, the contact part 66 extends downwards and contacts sequentially and alternately the first exposure area 27 (or 27') or the second exposure area 29 (29') closest to the conductive block 22. Each metal block 62 is the anode of a single organic solar cell.

Figure 8:
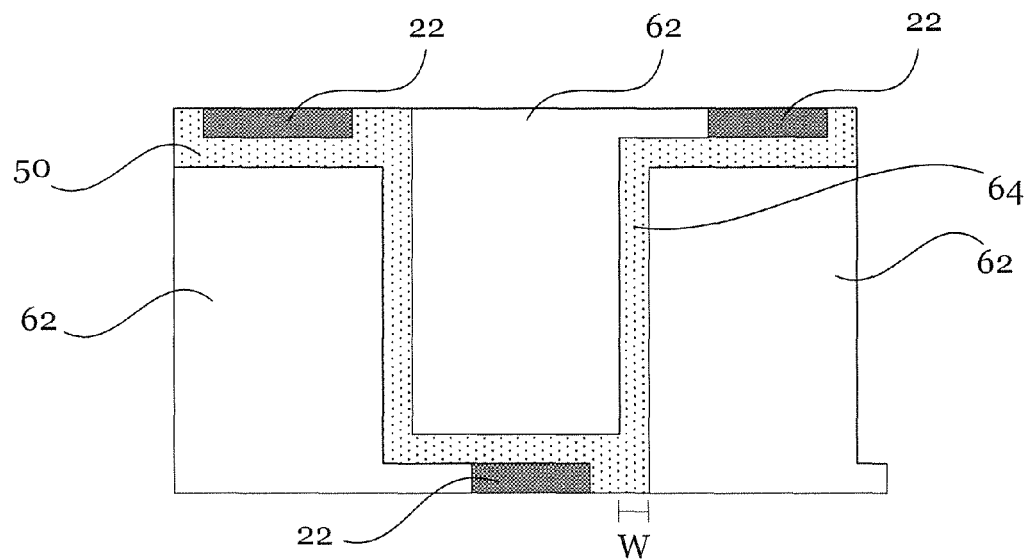
FIG. 8 shows a top view according to a preferred embodiment of the present invention.
Figure 9:
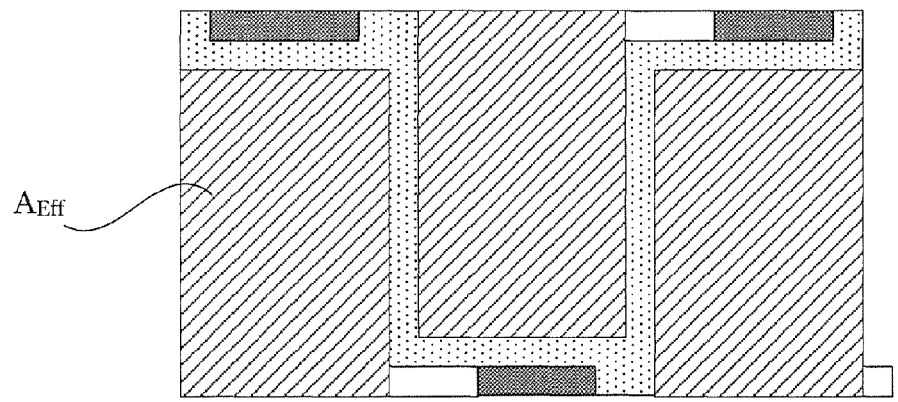
FIG. 9 shows a top view of effective power generating areas according to a preferred embodiment of the present invention.

The second gaps 64 of the metal layer 60 correspond to the first gaps 24 of the transparent conductive layer in the vertical direction. Their widths can be identical, which means that at least two side edges of the conductive block 22 and the metal blocks 62 are aligned in the vertical direction. Please refer to the top views in FIGS. 8 and 9. Because the effective power generating area $A_{Eff}$ of the organic solar cell is the region in the vertical direction having the complete cathode, active layer, and anode, as the sloped-line region in FIG. 9, the structure according to the present invention can improve the effective power generating area $A_{Eff}$ to its maximum. The width W of the first and second gaps 24, 64, which contribute no power generation, has been shrunk as small as possible. In other words, according to the serial structure of the present invention, the organic solar cells are arranged in a row without contact and their gaps are shrunk to the extreme. By using the notches on the other two side edges of the active layer, each metal block 62 of the metal layer 60 can contact the conductive block 22 of another organic solar cell and thus forming the serial structure.

In addition to increasing the effective power generating area as described above, the serial structure according to the present invention also reduces substantially the complexity in manufacturing serial organic solar cells. According to the present invention, while disposing the electron transport layer and the active layer, or further disposing the hole transport layer with edges aligning with the active layer, each layer can be manufactured as a whole. In other words, each single layer can be deposited directly by various methods, such large-area solution printing processes, including spray coating, inkjet printing, and roll-to-roll printing. By using the methods, only the notches on both side edges should be reserved for exposing a portion of the transparent electrode layer; it is no longer necessary to worry about the technical problem of micro shift in the above-mentioned non-electrode layers. This reduces the technical barrier for fabrication as well as ensuring the product quality. Besides, it is also beneficial to the product yield.

The above embodiment according to the present invention is an inverted structure. Nonetheless, the present invention also applies to non-inverted structure, which is formed by a transparent conductive layer (anode), a hole transport layer, an active layer, an electron transport layer, and a metal layer (cathode). In this case, instead of the electron transport layer, the layer for considering adding notches is the hole transport layer.

To sum up, the present invention discloses in detail a serial module of organic solar cell, which finishes the fabrication of the serial structure of cells in the preparation of organic solar cells. Thereby, by designing the layout of cells, the electron transport layer, the active layer, and the hole transport layer will not cover the transparent conductive layer completely. Instead, a portion of the transparent conductive layer is reserved for contacting the metal layer of the solar cells. In addition, the reserved region described above is moved to the edges, which solves the problem of insufficient power generating regions in manufacturing organic solar cells. Because the manufacturing cost is reduced and the power generation performance per unit area is enhanced, in short, the present invention indeed provides a serial module of organic solar cell and the method for manufacturing the same having economic and practical values. Currently, novel electronic products, such as wearable flexible electronics and smart cards, are developing towards the trend of lighter and thinner. In the future integrated applications, the power generating efficiency of the module should be maximized in an extremely limited space for replacing current batteries. Thereby the present invention provides a novel serial module structure of organic solar cells. In the limited space of practical applications, the power generating efficiency of organic solar cells can be improved effectively for satisfying the requirements of electronic products, which is beneficial to the development of promotion of future organic solar cells.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A method for manufacturing a serial module of organic solar cell, comprising steps of:
    disposing a transparent conductive layer on a substrate to form a plurality of conductive blocks, said plurality of conductive blocks formed by etching or laser process, a first gap formed between any two of said conductive blocks, the edges of any of said conductive blocks having a first side edge and a second side edge adjacent to each other, and said first side edge intersecting said second side edge at said first gap;
    disposing an active layer on said transparent conductive layer, said active layer having a plurality of notches on different sides of the periphery, and any two of said plurality of conductive blocks having a first exposure area and a second exposure area interlacedly exposed by said plurality of notches on said first side edge and said second side edge; and
    vapor-depositing a metal layer on said active layer, said metal layer comprising a plurality of metal blocks, having a second gap between adjacent metal blocks, any two of said plurality of metal blocks having a plurality of contact parts extending towards different side edges, overlapping at said first gap adjacent to said side in a vertical direction, extending downwards via said plurality of notches after overlapping said first gap, and said plurality of contact parts of said adjacent metal blocks contacting said first exposure area and said second exposure area of said plurality of conductive blocks on different sides;

where said first gap aligns with said second gap in the vertical direction.

2. The method for manufacturing a serial module of organic solar cell of claim 1, and before disposing said active layer further comprising a step of disposing an electron transport layer on said transparent conductive layer and the edges of said electron transport layer aligning with the edges of said transparent conductive layer.

3. The method for manufacturing a serial module of organic solar cell of claim 1, and before disposing said metal layer further comprising a step of disposing a hole transport layer on said active layer and said active layer, and the edges of said hole transport layer aligning with the edges of said active layer.

4. The method for manufacturing a serial module of organic solar cell of claim 1, wherein said active layer is formed by spray coating, inkjet printing, or roll-to-roll printing.

5. The method for manufacturing a serial module of organic solar cell of claim 1, wherein said plurality of metal blocks contact said first exposure area or said second exposure area alternately and respectively.

6. The method for manufacturing a serial module of organic solar cell of claim 1, wherein the widths of said first gap and said second gap are identical so that at least two side edges of said plurality of conductive blocks and said plurality of metal blocks are aligned vertically.

7. The method for manufacturing a serial module of organic solar cell of claim 6, wherein said width is greater than 0 millimeter and smaller than 20 millimeters.

* * * * *